United States Patent
Katsuno et al.

(10) Patent No.: US 8,421,085 B2
(45) Date of Patent: Apr. 16, 2013

(54) SEMICONDUCTOR LIGHT-EMITTING DEVICE

(75) Inventors: Hiroshi Katsuno, Tokyo (JP); Yasuo Ohba, Kanagawa-ken (JP); Mitsuhiro Kushibe, Tokyo (JP); Kei Kaneko, Kanagawa-ken (JP); Shinji Yamada, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/873,678

(22) Filed: Sep. 1, 2010

(65) Prior Publication Data

US 2011/0220911 A1   Sep. 15, 2011

(30) Foreign Application Priority Data

Mar. 11, 2010   (JP) .................................. 2010-054293

(51) Int. Cl.
   *H01L 33/22*   (2010.01)
(52) U.S. Cl.
   USPC .. 257/76; 257/98; 257/E33.012; 257/E33.055
(58) Field of Classification Search ............... 257/76, 257/79, 98, 99, E33.012
   See application file for complete search history.

(56) References Cited

U.S. PATENT DOCUMENTS

| 7,176,479 B2 | 2/2007 | Ohba et al. | |
|---|---|---|---|
| 2005/0285132 A1* | 12/2005 | Orita | 257/99 |
| 2007/0181895 A1* | 8/2007 | Nagai | 257/98 |
| 2008/0042149 A1* | 2/2008 | Yoon et al. | 257/79 |
| 2010/0011894 A1 | 1/2010 | Wang et al. | |

FOREIGN PATENT DOCUMENTS

| JP | 5-167101 | 7/1993 |
|---|---|---|
| JP | 6-82862 | 10/1994 |
| JP | 7-15038 | 1/1995 |
| JP | 8-31819 | 2/1996 |
| JP | 2003-309289 | 10/2003 |
| JP | 2004-47760 | 2/2004 |
| JP | 2005-150675 | 6/2005 |
| JP | 2005-191530 | 7/2005 |
| JP | 2006-135311 | 5/2006 |
| JP | 2007-142277 | 6/2007 |
| JP | 2007-529879 | 10/2007 |
| JP | 2008-47858 | 2/2008 |

OTHER PUBLICATIONS

U.S. Appl. No. 13/204,082, filed Aug. 5, 2011, Katsuno, et al.
U.S. Appl. No. 13/222,302, filed Aug. 31, 2011, Katsuno, et al.
Japanese Office Action issued May 7, 2012 in patent application No. 2010-054293 with English translation.

(Continued)

*Primary Examiner* — Minh-Loan T Tran
*Assistant Examiner* — Fazli Erdem
(74) *Attorney, Agent, or Firm* — Oblon, Spivak, McClelland, Maier & Neustadt, L.L.P.

(57) ABSTRACT

According to one embodiment, a semiconductor light-emitting device includes a first semiconductor layer of a first conductivity type, a second semiconductor layer of a second conductivity type, a light-emitting layer, a third semiconductor layer and a first electrode. The light-emitting layer is provided between the first and second semiconductor layers. The third semiconductor layer is provided on opposite side of the first semiconductor layer from the light-emitting layer, has a lower impurity concentration than the first semiconductor layer, and includes an opening exposing part of the first semiconductor layer. The first electrode is in contact with the first semiconductor layer through the opening. The third semiconductor layer further includes a rough surface portion which is provided on opposite side from the first semiconductor layer and includes a surface asperity larger than wavelength in the third semiconductor layer of peak wavelength of emission light emitted from the light-emitting layer.

19 Claims, 10 Drawing Sheets

OTHER PUBLICATIONS

T. Fujii, et al. "Increase in the extraction efficiency of GaN-based light-emitting diodes via surface roughening", Applied Physics Letters, vol. 84, No. 6, Feb. 9, 2004. pp. 855-857.

Office Action issued Oct. 2, 2012 in Japanese Patent Application No. 2010-054293 with English language translation.

* cited by examiner

SEMICONDUCTOR LIGHT-EMITTING DEVICE

CROSS-REFERENCE TO RELATED APPLICATIONS

This application is based upon and claims the benefit of priority from the prior Japanese Patent Application No. 2010-054293, filed on Mar. 11, 2010; the entire contents of which are incorporated herein by reference.

FIELD

Embodiments described herein relate generally to a semiconductor light-emitting device.

BACKGROUND

In semiconductor light-emitting devices such as light-emitting diodes (LEDs), it is desirable to increase the light emission efficiency (external quantum efficiency). To this end, it is necessary to improve the internal quantum efficiency and light extraction efficiency.

For instance, T. Fujii, Y. Gao, R. Sharma, E, L. Hu, S. P. DenBaars, and S. Nakamura, Applied Physics Letters vol. 84 No. 6, pp. 855-857 (2004) proposes a configuration for improving the light extraction efficiency. In this configuration, the surface of the n-type GaN layer is provided with a surface asperity. However, despite this technique, there is room for improvement in the efficiency of semiconductor light-emitting devices.

DETAILED DESCRIPTION

Figure 1A:
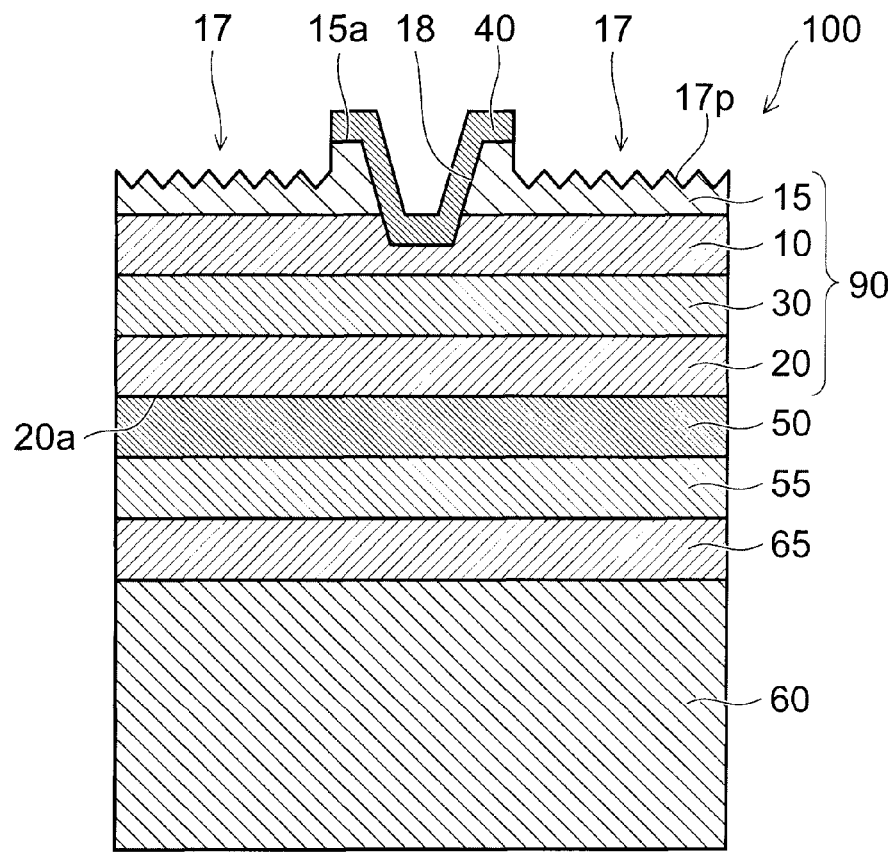
FIG. 1A and FIG. 1B are schematic views showing a semiconductor light-emitting device.

In general, according to one embodiment, a semiconductor light-emitting device includes a first semiconductor layer of a first conductivity type, a second semiconductor layer of a second conductivity type, a light-emitting layer, a third semiconductor layer and a first electrode. The light-emitting layer is provided between the first semiconductor layer and the second semiconductor layer. The third semiconductor layer is provided on opposite side of the first semiconductor layer from the light-emitting layer, has an impurity concentration lower than an impurity concentration of the first semiconductor layer, and includes an opening exposing a part of the first semiconductor layer. The first electrode is in contact with the first semiconductor layer through the opening. The third semiconductor layer further includes a rough surface portion. The rough surface portion is provided on opposite side from the first semiconductor layer and includes a surface asperity larger than wavelength in the third semiconductor layer of peak wavelength of emission light emitted from the light-emitting layer.

Embodiments of the invention will now be described in detail with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same components as those described previously with reference to earlier figures are labeled with like reference numerals, and the detailed description thereof is omitted as appropriate.

First Embodiment

Figure 1B:
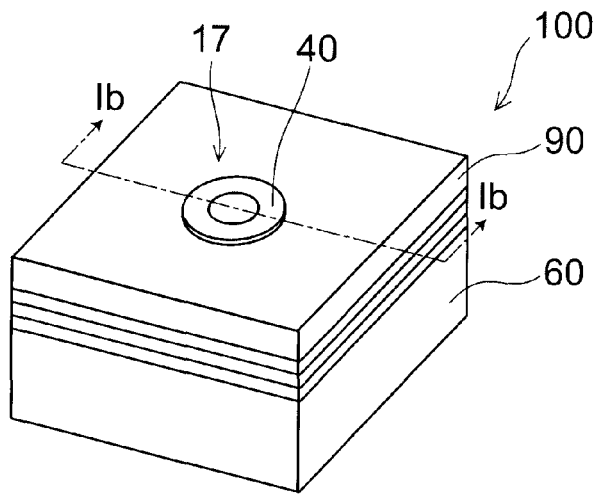

FIG. 1A and FIG. 1B are schematic views illustrating the configuration of a semiconductor light-emitting device according to a first embodiment.

More specifically, FIG. 1B is a schematic perspective view illustrating the configuration of the semiconductor light-emitting device 100. FIG. 1A is a cross-sectional view taken along line 1b-1b shown in FIG. 1B.

As shown in FIG. 1A, the semiconductor light-emitting device 100 includes a first semiconductor layer 10 of a first conductivity type, a second semiconductor layer 20 of a second conductivity type, a light-emitting layer 30, a third semiconductor layer 15, and a first electrode 40.

The light-emitting layer 30 is provided between the first semiconductor layer 10 and the second semiconductor layer 20.

The third semiconductor layer 15 is provided on the opposite side of the first semiconductor layer 10 from the light-emitting layer 30. The third semiconductor layer 15 has a lower impurity concentration than the first semiconductor layer 10.

The third semiconductor layer 15 includes an opening 18 and a rough surface portion 17. The opening 18 exposes part of the first semiconductor layer 10. The opening 18 is formed in the first major surface 15a on the opposite side of the third semiconductor layer 15 from the first semiconductor layer 10. The opening 18 extends from the first major surface 15a to the first semiconductor layer 10. The rough surface portion 17 is provided on the first major surface 15a and includes a surface asperity 17p. The size of the surface asperity 17p is larger than the wavelength in the third semiconductor layer 15 of the peak wavelength of emission light emitted from the light-emitting layer 30.

The first electrode 40 is in contact with the first semiconductor layer 10 through the opening 18.

For instance, in the semiconductor light-emitting device 100, a stacked structure 90 is provided above a conductive substrate 60. The stacked structure 90 includes a first semiconductor layer 10, a second semiconductor layer 20, a light-emitting layer 30, and a third semiconductor layer 15. The second semiconductor layer 20 is provided on the conductive substrate 60 side of the third semiconductor layer 15. The light-emitting layer 30 is provided between the second semiconductor layer 20 and the third semiconductor layer 15. The first semiconductor layer 10 is provided between the light-emitting layer 30 and the third semiconductor layer 15.

For instance, the first semiconductor layer 10, the second semiconductor layer 20, the light-emitting layer 30, and the third semiconductor layer 15 include nitride semiconductors. The first conductivity type is e.g. n-type, and the second conductivity type is e.g. p-type. In this case, the first semiconductor layer 10 is an n-type semiconductor layer, and the second semiconductor layer 20 is a p-type semiconductor layer. However, this embodiment is not limited thereto. The first conductivity type may be p-type, and the second conductivity type may be n-type. In the following description, it is assumed that the first conductivity type is n-type, and the second conductivity type is p-type.

The third semiconductor layer 15 has a lower impurity concentration than the first semiconductor layer 10. For instance, the third semiconductor layer 15 a non-doped semiconductor layer. For instance, the impurity concentration in the third semiconductor layer 15 is lower than the detection limit. More particularly, the impurity concentration in the third semiconductor layer 15 can be the background concentration of n-type and p-type impurity observed in the case where the third semiconductor layer 15 is not intentionally doped with n-type and p-type impurity. The third semiconductor layer 15 may contain impurity at a lower concentration than the first semiconductor layer 10.

As shown in FIG. 1A, an opening 18 is formed in the first major surface 15a on the opposite side of the third semiconductor layer 15 from the first semiconductor layer 10. The opening 18 communicates from the major surface 15a of the third semiconductor layer 15 to the first semiconductor layer 10. In this example, the first electrode 40 is in contact with the first semiconductor layer 10 through the opening 18, and provided on the major surface 15a of the third semiconductor layer 15.

Furthermore, a rough surface portion 17 is provided on the major surface 15a side of the third semiconductor layer 15. In this example, the rough surface portion 17 is juxtaposed with the first electrode 40 on the major surface 15a side. The rough surface portion 17 includes a surface asperity 17p. This surface asperity 17p suppresses the reflection of emission light at the interface between the third semiconductor layer 15 and the outside. The emission light is emitted from the light-emitting layer 30 and propagated through the third semiconductor layer 15 toward the outside of the stacked structure 90.

Figure 2A:
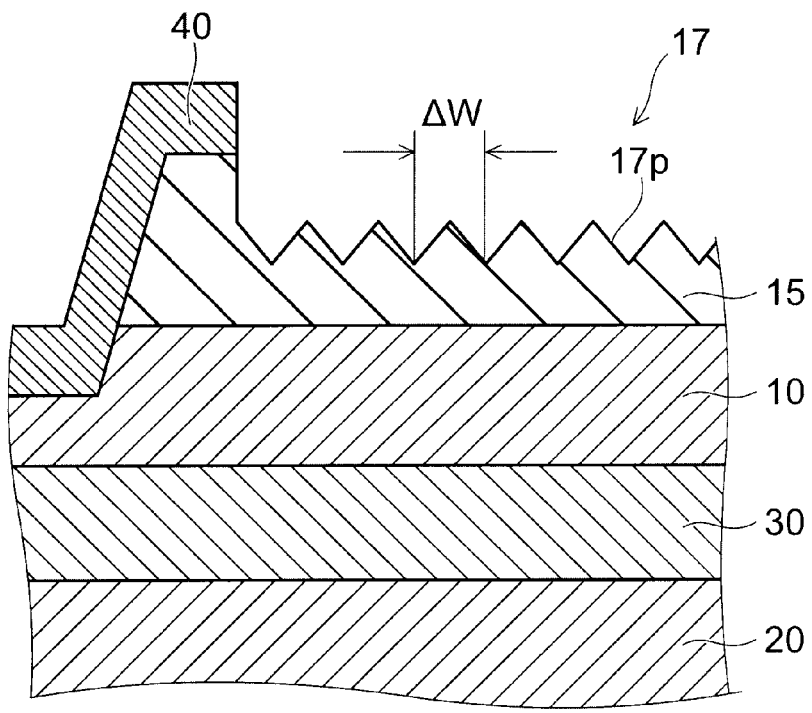
FIG. 2A is a schematic cross-sectional view showing the configuration of part of the semiconductor light-emitting device.
Figure 2B:
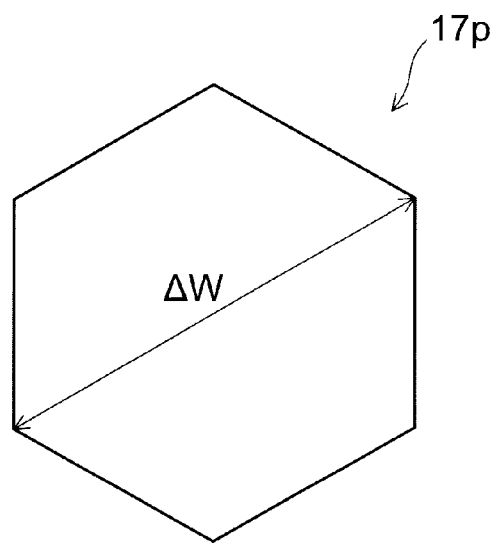
FIG. 2B illustrates an example of a planar shape of the surface asperity shown in FIG. 2A.

FIG. 2A is schematic cross-sectional view illustrating the configuration of part of the semiconductor light-emitting device according to the first embodiment. FIG. 2B illustrates an example of a planar shape of the surface asperity 17p.

As shown in FIG. 2A, the surface asperity 17p provided in the rough surface portion 17 includes a plurality of protrusions. The protrusion is formed by processing the surface of the third semiconductor layer 15.

The maximum width $\Delta W$ of the protrusion along the direction perpendicular to the stacking direction from the first semiconductor layer 10 to the second semiconductor layer 20 is set larger than the peak wavelength in the third semiconductor layer 15 of emission light emitted from the light-emitting layer 30.

This enhances the effect of reducing the reflection of emission light at the interface between the third semiconductor layer 15 and the outside. Here, the peak wavelength refers to the wavelength of light with maximum intensity in the emission light emitted from the light-emitting layer 30. The peak wavelength is a wavelength corresponding to the peak value of the spectral distribution of emission light. For a spectrum having two or more local maxima except noise levels, the wavelength for any one of the peak values may be selected.

As shown in FIG. 2B, for instance, in the third semiconductor layer 15 made of a nitride semiconductor, the planar shape of the protrusion as viewed in the stacking direction (the direction from the first semiconductor layer 10 to the second semiconductor layer 20) can be a generally hexagonal shape. In this case, the maximum width $\Delta W$ is the width between diagonal vertices of the hexagon.

As shown in FIG. 1A, a second electrode 50 electrically connected to the second semiconductor layer 20 is provided on the second major surface 20a of the second semiconductor layer 20 on the opposite side from the light-emitting layer 30. In this example, an adhesion metal layer 55 is provided between the second electrode 50 and the conductive substrate 60. Furthermore, a bonding metal layer 65 is provided between the adhesion metal layer 55 and the conductive substrate 60. The bonding metal layer 65 is made of e.g. AuSn solder. In this example, the first electrode 40 is an n-side electrode, and the second electrode 50 is a p-side electrode.

An example method for fabricating the semiconductor light-emitting device 100 is briefly described.

For instance, on a substrate, not shown, a third semiconductor layer 15, a first semiconductor layer 10, a light-emitting layer 30, and a second semiconductor layer 20 are crystal grown in the order of the third semiconductor layer 15, the first semiconductor layer 10, the light-emitting layer 30, and the second semiconductor layer 20 to form a stacked structure 90. Subsequently, a second electrode 50 is formed on the second major surface 20a, or the upper surface, of the second semiconductor layer 20. An adhesion metal layer 55 is formed on the second electrode 50.

Next, for instance, a bonding metal layer 65 provided on a conductive substrate 60 is opposed and laminated to the adhesion metal layer 55 on the second semiconductor layer 20 side. Thus, the stacked structure 90 is bonded to the conductive substrate 60. Furthermore, for instance, by using a process such as laser lift-off described later, the substrate, not shown, is separated from the stacked structure 90.

Subsequently, a first electrode 40 and a rough surface portion 17 are formed on the first major surface 15a of the third semiconductor layer 15 of the stacked structure 90. For instance, part of the first major surface 15a is processed by e.g. etching to form a prescribed surface asperity 17p, thereby forming a rough surface portion 17. As an alternative method for forming a rough surface portion 17, for instance, the surface asperity left after the separation of the substrate, not shown, can be used as a rough surface portion 17.

Figure 3A:
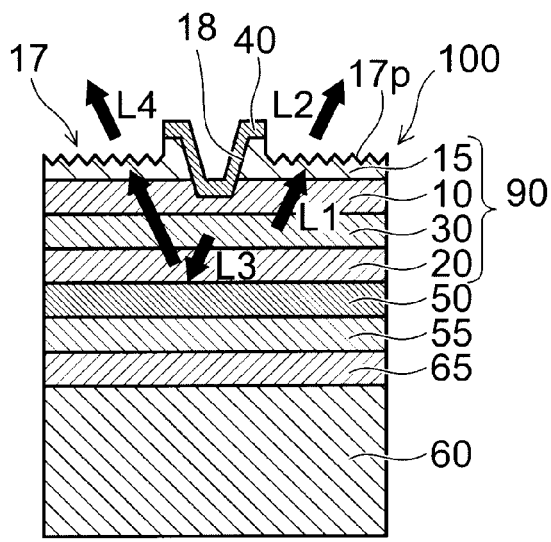
FIG. 3A, FIG. 3B, and FIG. 3C are schematic views showing the characteristics of the semiconductor light-emitting device.
Figure 3B:
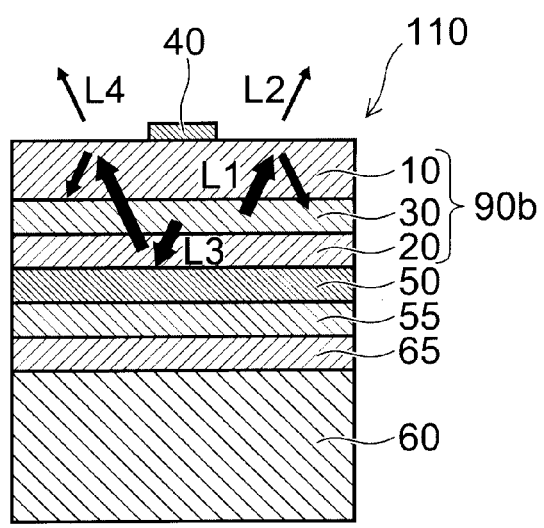
Figure 3C:
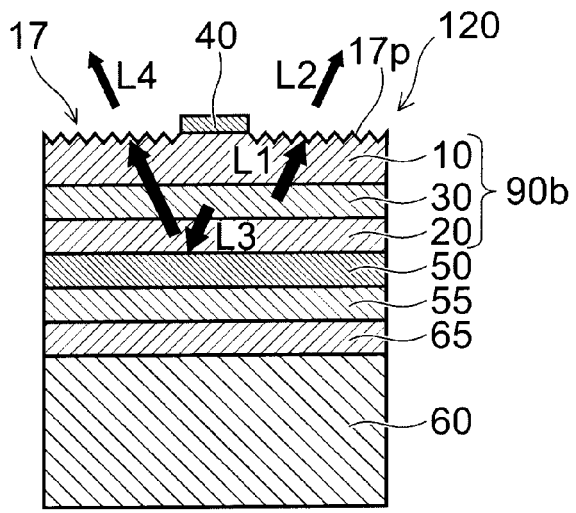

FIG. 3A, FIG. 3B and FIG. 3C are schematic views illustrating the characteristics of the semiconductor light-emitting device.

More specifically, FIG. 3A illustrates the characteristics of the semiconductor light-emitting device 100 according to this embodiment. FIG. 3B illustrates the characteristics of a semiconductor light-emitting device 110 of a first comparative example in which the rough surface portion 17 is not provided. FIG. 3C illustrates the characteristics of a semiconductor light-emitting device 120 of a second comparative example in which the rough surface portion 17 is provided on the surface of the first semiconductor layer 10.

The semiconductor light-emitting devices 110 and 120 are in common with the semiconductor light-emitting device 100 in that the stacked structures 90b and 90, respectively, including the first semiconductor layer 10, the light-emitting layer 30, and the second semiconductor layer 20 are provided on the conductive substrate 60.

The semiconductor light-emitting device 110 is different from the semiconductor light-emitting device 100 in that the semiconductor light-emitting device 110 does not include the third semiconductor layer 15 and that the rough surface portion 17 is not provided on the surface of the first semiconductor layer 10 serving as a light extraction surface.

The semiconductor light-emitting device 120 is different from the semiconductor light-emitting device 100 in that the semiconductor light-emitting device 120 does not include the third semiconductor layer 15 and that the location provided with the rough surface portion 17 is the surface of the first semiconductor layer 10.

In FIGS. 3A to 3C, each semiconductor light-emitting device emits emission light from the light-emitting layer 30 by passage of current from the conductive substrate 60 through the second electrode 50 to the first electrode 40. Light L1, which is part of the emission light emitted from the light-emitting layer 30, is partly extracted outside as light L2. The second electrode 50 functions as a reflective electrode. Light L3 emitted from the light-emitting layer 30 and propagated toward the second electrode 50 is reflected at the interface between the second electrode 50 and the second semiconductor layer 20 and emitted outside as light L4.

In the semiconductor light-emitting device 110 of the first comparative example shown in FIG. 3B, light directed outside from the first semiconductor layer 10 at an incident angle larger than the critical angle is totally reflected at the interface between the first semiconductor layer 10 and the outside. The critical angle is determined by the difference in refractive index between the first semiconductor layer 10 and the outside (of the stacked structure 90b). Consequently, the intensity of light emitted outside from the semiconductor light-emitting device 110 is lower than in the semiconductor light-emitting devices 100 and 120.

In the semiconductor light-emitting device 120 of the second comparative example shown in FIG. 3C, the rough surface portion 17 is provided on the surface of the first semiconductor layer 10. Thus, the effective incident angle of light passed through the interface between the first semiconductor layer 10 and the outside and extracted outside is larger than in the semiconductor light-emitting device 110. Consequently, in the semiconductor light-emitting device 120, the intensity of light emitted outside is higher than in the semiconductor light-emitting device 110.

However, in the semiconductor light-emitting device 120, the thickness of the first semiconductor layer 10 is set thicker so that a surface asperity 17p having a larger size than the emission wavelength can be formed on the first semiconductor layer 10. Furthermore, the carrier concentration (e.g., impurity concentration) of the first semiconductor layer 10 is set higher so that a low-resistance ohmic contact can be formed between the first electrode 40 and the first semiconductor layer 10. Thus, optical absorption in the first semiconductor layer 10 increases, which results in decreasing the light extraction efficiency. The rough surface portion 17 is indeed formed in the semiconductor light-emitting device 120 of the second comparative example. However, it is on the first semiconductor layer 10 that the rough surface portion 17 is formed. Hence, loss of light still exists, and the increase of light extraction efficiency is insufficient.

Furthermore, in the semiconductor light-emitting device 120, the rough surface portion 17 is formed on the surface of the first semiconductor layer 10 highly doped with n-type impurity. Hence, in the surface asperity processing, the rough surface portion 17 suffers surface roughness and impurity segregation. This may cause the decrease of light extraction efficiency.

In contrast, in the semiconductor light-emitting device 100 according to this embodiment illustrated in FIG. 3A, the rough surface portion 17 is provided on the third semiconductor layer 15. The third semiconductor layer 15 has a lower impurity concentration than the first semiconductor layer 10, and has a lower internal absorption of light. Hence, the attenuation of emission light reflected at the interface between the third semiconductor layer 15 and the outside can be made lower than in the semiconductor light-emitting device 120 of the second comparative example. Thus, in the semiconductor light-emitting device 100, the intensity of light L2 and light L4 emitted outside can be made higher than in the semiconductor light-emitting device 120 of the second comparative example.

Furthermore, in the semiconductor light-emitting device 100, the surface asperity 17p is formed on the surface of the third semiconductor layer 15 having low impurity concentration. Hence, the semiconductor light-emitting device 100 is advantageous also in that the surface asperity 17p is less prone to surface roughness and impurity segregation.

Thus, in the semiconductor light-emitting device 100 according to this embodiment, a semiconductor light-emitting device with high efficiency is achieved.

Next, an example method for manufacturing the semiconductor light-emitting device 100 according to this embodiment is described.

Figure 4A:
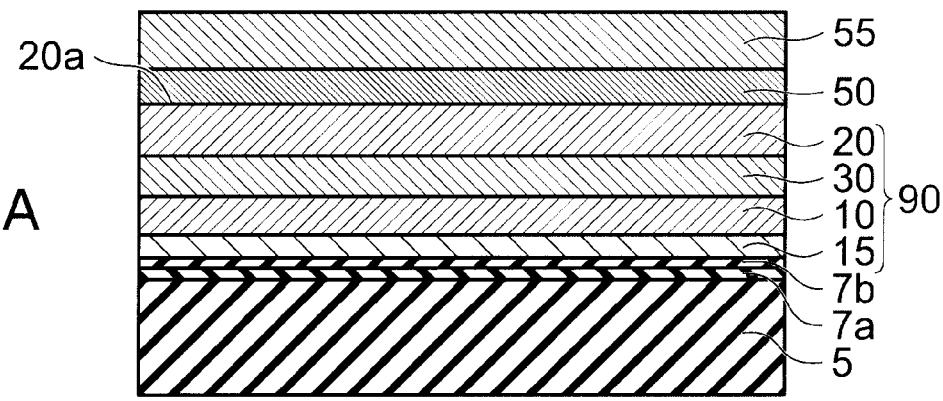
FIG. 4A and FIG. 4B are sequential schematic cross-sectional views showing a method for manufacturing a semiconductor light-emitting device.
Figure 4B:
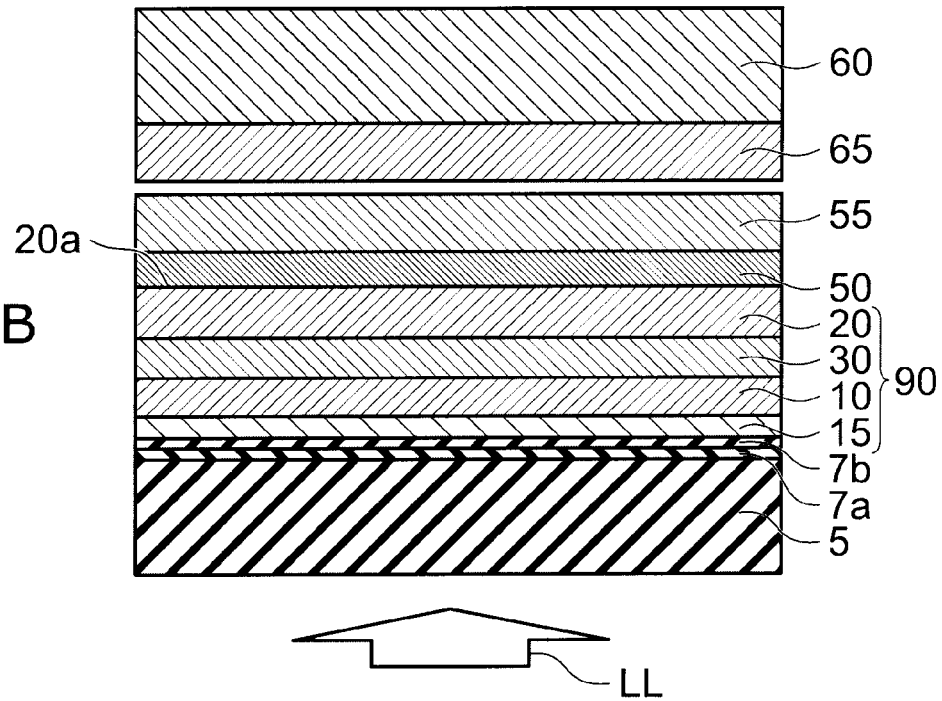

FIG. 4A and FIG. 4B are sequential schematic cross-sectional views illustrating a method for manufacturing the semiconductor light-emitting device according to the first embodiment.

As shown in FIG. 4A, the semiconductor light-emitting device 100 is composed of nitride semiconductors formed on a sapphire substrate 5. More specifically, the semiconductor light-emitting device 100 can have a structure in which, for instance, by metal organic chemical vapor deposition, the following layers are sequentially stacked on a substrate whose surface is a sapphire c-surface: a high carbon concentration first AlN buffer layer 7a (carbon concentration $3\times10^{18}$-$5\times10^{20}$ cm$^{-3}$) with a thickness of 3-20 nm, a high-purity second AlN buffer layer 7b (carbon concentration $1\times10^{16}$-$3\times10^{18}$ cm$^{-3}$) with a thickness of 2 μm, a non-doped GaN buffer layer with a thickness of 2 μm, a Si-doped n-type GaN contact layer (Si concentration $1\times10^{18}$-$1\times10^{20}$ cm$^{-3}$) with a thickness of 2 μm, a Si-doped n-type $Al_{0.10}Ga_{0.90}N$ cladding layer (Si concentration $1\times10^{18}$ cm$^{-3}$) with a thickness of 0.02 μm, a light-emitting layer 30 having a multiple quantum well structure with Si-doped n-type $Al_{0.11}Ga_{0.89}N$ barrier layers (Si concentration 1.1-$1.5\times10^{19}$ cm$^{-3}$) and GaInN light-emitting layers (wavelength 375-395 nm) alternately stacked three periods with a thickness of 0.075 μm, an $Al_{0.11}Ga_{0.89}N$ barrier layer (Si concentration 1.1-$1.5\times10^{19}$ cm$^{-3}$) with a thickness of 0.01 μm serving as the last barrier layer of the multiple quantum well, a Si-doped n-type $Al_{0.11}Ga_{0.89}N$ layer (Si concentration 0.8-$1.0\times10^{19}$ cm$^{-3}$) with a thickness of 0.01 μm, a non-doped $Al_{0.11}Ga_{0.89}N$ spacer layer with a thickness of 0.02 μm, a Mg-doped p-type $Al_{0.28}Ga_{0.72}N$ cladding layer (Mg concentration $1\times10^{19}$ cm$^{-3}$) with a thickness of 0.02 μm, a Mg-doped p-type GaN contact layer (Mg concentration $1\times10^{19}$ cm$^{-3}$) with a thickness of 0.1 μm, and a highly Mg-doped p-type GaN contact layer (Mg concentration 5-$9\times10^{19}$ cm$^{-3}$) with a thickness of 0.02 μm.

The above non-doped GaN buffer layer serves as the third semiconductor layer 15. At least one of the Si-doped n-type GaN contact layer and the Si-doped n-type $Al_{0.10}Ga_{0.90}N$ cladding layer is included in the first semiconductor layer 10. At least one of the Mg-doped $Al_{0.28}Ga_{0.72}N$ cladding layer, the Mg-doped p-type GaN contact layer, and the highly Mg-doped p-type GaN contact layer is included in the second semiconductor layer 20.

If the Mg concentration of the highly Mg-doped p-type GaN contact layer is as relatively high as $1 \times 10^{20}$ cm$^{-3}$ or more and less than $1 \times 10^{21}$ cm$^{-3}$, the ohmic contact with the p-side electrode can be improved. However, in the case of semiconductor light-emitting diodes, in contrast to semiconductor laser diodes, the distance between the contact layer and the light-emitting layer is short. Hence, there is concern about characteristics degradation due to Mg diffusion. Here, the contact area between the p-side electrode and the highly Mg-doped p-type GaN contact layer is large, which results in low current density during operation. Exploiting this fact, the Mg concentration in the highly Mg-doped p-type GaN contact layer can be reduced to $1 \times 10^{19}$ cm$^{-3}$ or more and less than $1 \times 10^{20}$ cm$^{-3}$ without significantly impairing the electrical characteristics. Thus, Mg diffusion can be prevented, and the light emission characteristics can be improved.

The high carbon concentration first AlN buffer layer 7a serves to relax the difference in crystal type from the substrate, and particularly reduces screw dislocations. Furthermore, the high-purity second AlN buffer layer 7b serves to planarize the surface at the atomic level. This reduces crystal defects in the non-doped GaN buffer layer grown thereon. To this end, the film thickness of the high-purity second AlN buffer layer 7b is preferably thicker than 1 μm. Furthermore, to prevent warpage due to strain, the thickness of the high-purity second AlN buffer layer 7b is preferably 4 μm or less. The high-purity second AlN buffer layer 7b is not limited to AlN, but may be made of $Al_xGa_{1-x}N$ ($0.8 \leq x \leq 1$). Thus, the wafer warpage can be compensated.

The non-doped GaN buffer layer is formed by three-dimensional island growth on the high-purity second AlN buffer layer 7b, and thereby serves to reduce crystal defects. To planarize the growth surface, the average film thickness of the non-doped GaN buffer layer is preferably 2 μm or more. From the viewpoint of reproducibility and warpage reduction, the total film thickness of the non-doped GaN buffer layer is suitably 2-10 μm.

By using these buffer layers, crystal defects can be reduced to approximately 1/10 as compared with conventional AlN buffer layers formed by low-temperature growth. This technique makes it possible to produce a highly efficient semiconductor light-emitting device despite high Si doping of the n-type GaN contact layer and light emission in the ultraviolet band. Furthermore, by reducing crystal defects in the non-doped GaN buffer layer, absorption of light in the non-doped GaN buffer layer can also be suppressed.

Next, electrode formation on the stacked structure and bonding of the stacked structure to the conductive substrate are described.

First, to form a p-side electrode, a vacuum evaporation apparatus is used for continuous formation of, for instance, Ag to a film thickness of 200 nm and Pt to a film thickness of 2 nm. After lift-off, sintering treatment is performed in an oxygen atmosphere at 400° C. for 1 min. Then, as an adhesion metal layer 55, for instance, Ni/Au is formed to a film thickness of 1000 nm on the p-side electrode.

Next, an AuSn solder with a film thickness of 3 μm formed on the conductive substrate made of Ge is opposed to the adhesion metal layer 55 formed on the stacked structure. By heating to a temperature equal to or higher than the eutectic point of AuSn, such as 300° C., the conductive substrate is bonded to the sapphire substrate.

Then, from the sapphire substrate side, for instance, the third harmonic (355 nm) or fourth harmonic (266 nm) laser light of an YVO$_4$ solid-state laser is applied. The laser light has a wavelength shorter than the forbidden band wavelength corresponding to the forbidden bandwidth of GaN in the GaN buffer layer (e.g., the aforementioned non-doped GaN buffer layer). That is, the laser light has energy higher than the forbidden bandwidth of GaN.

This laser light is efficiently absorbed in the region on the single crystal AlN buffer layer (in this example, the second AlN buffer layer) side of the GaN buffer layer (non-doped GaN buffer layer). Thus, GaN in the GaN buffer layer on the single crystal AlN buffer layer side is decomposed by generated heat. The decomposed GaN is removed by e.g. hydrochloric acid treatment. Thus, the sapphire substrate is removed and separated from the stacked structure.

Next, formation of an electrode and a rough surface portion 17 (surface asperity 17p) on the exposed stacked structure is described.

After removing the sapphire substrate from the conductive substrate, part of the non-doped GaN buffer layer (third semiconductor layer 15) on the conductive substrate is removed to expose the n-type contact layer (e.g., the aforementioned Si-doped n-type GaN contact layer, i.e., first semiconductor layer 10). Here, to prevent step disconnection of the n-side electrode, processing into a tapered shape is preferable. For instance, a recess tapered at 50° can be formed by dry etching with chlorine gas using a resist mask.

Furthermore, by e.g. lift-off, a Ti/Pt/Au stacked film, for instance, is formed to a thickness of e.g. 500 nm so as to cover entirely the exposed n-type contact layer and partly the non-doped GaN buffer layer. The stacked film is patterned into an n-side electrode. Subsequently, the surface of the non-doped GaN buffer layer outside the n-side electrode is processed by alkaline etching with KOH solution to form a surface asperity 17p. Thus, a rough surface portion 17 is formed. The etching with KOH solution is performed under the following condition, for instance: 1 mol/L of the solution is heated to 80° C., and etching is performed for 20 min.

Next, by cleavage or diamond blade cutting, the conductive substrate is cut into individual devices. Thus, the semiconductor light-emitting device is fabricated.

The semiconductor light-emitting device 100 according to this embodiment includes at least semiconductor layers including an n-type semiconductor layer, a p-type semiconductor layer, and a light-emitting layer sandwiched therebetween. The material of the semiconductor layers is not particularly limited. For instance, gallium nitride-based compound semiconductors such as $Al_xGa_{1-x-y}In_yN$ ($x \geq 0$, $y \geq 0$, $x+y \leq 1$) are used. The method for forming these semiconductor layers is not particularly limited. For instance, known methods such as metal organic chemical vapor deposition and molecular beam epitaxy can be used.

The conductive substrate can be made of any conductive material, and is not particularly limited. For instance, a semiconductor substrate of Si or Ge, and a metal plate of Cu or CuW can be used. Furthermore, the substrate does not need to be entirely conductive. A resin plate including metal wirings may also be used.

The p-side electrode includes at least silver or an alloy thereof. For instance, a single layer film of metal other than silver has substantial reflection efficiency in the visible band. However, the reflection efficiency of a single layer film of metal other than silver tends to decrease with the decrease of wavelength in the ultraviolet region of 400 nm or less. In contrast, silver has high reflection efficiency characteristics also for light in the ultraviolet band of 370 nm or more and 400 nm or less. Hence, in the case of semiconductor light-emitting devices for ultraviolet emission with the p-side electrode made of a silver alloy, it is preferable that the portion of the p-side electrode on the semiconductor interface side have a higher component ratio of silver. The film thickness of the p-side electrode is preferably 100 nm or more to ensure the light reflection efficiency.

To prevent solder from diffusing into or reacting with the p-side electrode, a diffusion prevention layer in electrical contact with the p-side electrode may be provided on the p-side electrode. The diffusion prevention layer has the property of not reacting with silver, or not actively diffusing into silver.

The diffusion prevention layer can be made of a single layer film or a stacked film of high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), and platinum (Pt).

More preferably, the metal constituting the diffusion prevention layer has high work function so that some diffusion causes no problem, and the metal is likely to form ohmic contact with the p-type GaN contact layer. Such metals include iron (Fe), cobalt (Co), nickel (Ni), rhodium (Rh), tungsten (W), rhenium (Re), iridium (Ir), and platinum (Pt).

In the case of a single layer film, the film thickness of the diffusion prevention layer is preferably in the range from 5 to 200 nm so that the film state can be maintained. In the case of a stacked film, the film thickness is not particularly limited, but can be selected in the range from 10 to 10000 nm, for instance.

When the stacked structure on the sapphire substrate is bonded to the conductive substrate of e.g. Ge, and when GaN is decomposed by laser light to remove the sapphire substrate, crystals are susceptible to crystal defects and damage. The crystal defects and damage are caused by the thermal expansion coefficient difference between the conductive substrate and sapphire or GaN, heat due to local heating, and products generated by decomposition of GaN. If crystal defects and damage occur, Ag of the p-side electrode diffuses through the crystal defects and damage. This results in accelerated increase of leaks and crystal defects inside the crystal.

In this embodiment, a high quality semiconductor layer can be formed by using a single crystal AlN buffer layer. Hence, damage to crystals is significantly reduced. Furthermore, when GaN is decomposed by laser light, heat is dissipated into the AlN buffer layer located in the close vicinity of GaN and having high thermal conductivity characteristics. Hence, thermal damage due to local heating is less likely to occur.

As the size of the n-side electrode formed on the n-type contact layer increases, its contact resistance to the n-type contact layer decreases. Hence, the operating voltage is reduced. Conversely, as the size of the n-side electrode decreases, a smaller proportion of emitted light is absorbed or prevented from going outside by the n-side electrode. Hence, the light extraction efficiency increases. On the other hand, part of the n-side electrode is used also as an electrode for wire bonding. Hence, the n-side electrode requires a considerable amount of area, such as a diameter of 80 to 120 μm. With these factors taken into consideration, the area and shape of the exposed n-type contact layer and the area and shape of the n-side electrode can be freely determined.

With the thinning of the film thickness of the n-type contact layer, the lateral spread of current is limited. This results in nonuniform light emission and increased operating voltage due to nonuniform current injection. With the thickening of the film thickness of the n-type contact layer, the cost increases due to prolonged growth. However, in general, the Si-doped n-type GaN contact layer has low sheet resistance. Hence, the influence of thinning on the nonuniform current injection is limited.

Furthermore, there is an optimum value for the film thickness of the n-type contact layer in improving the crystal quality. The optimum value depends on the growth condition of the buffer layer and the impurity concentration of the n-type contact layer. Furthermore, by thinning the n-type contact layer, the substrate warpage can be reduced, allowing yield improvement. With these taken into consideration, the film thickness of the n-type contact layer can be freely determined.

The method for forming the surface asperity $17p$ of the rough surface portion 17 may be either wet etching or dry etching. Alkaline etching with e.g. KOH solution provides anisotropic etching along the surface orientation of the GaN crystal, mainly along $\{10\text{-}1\text{-}1\}$. This results in a generally hexagonal pyramid structure. The etching rate and the size and density of hexagonal pyramids are greatly varied with the etching temperature and time, pH (adjusted by addition of other substances), concentration, and presence or absence of UV light or UV laser irradiation.

As the etching amount (the depth from the surface before etching to the deepest position of the surface asperity $17p$ formed by etching) increases, the surface asperity $17p$ is formed more densely and in a larger size. In the case of processing GaN by dry etching, the N surface, in contrast to the Ga surface, is susceptible to crystal orientation and dislocations, and easily subjected to anisotropic etching. The surface of GaN grown on the c-surface sapphire substrate is normally a Ga surface. On the other hand, the surface of GaN exposed by removing the sapphire substrate is an N surface. Thus, a surface asperity $17p$ with a size equal to or larger than the emission wavelength is easily formed by anisotropic etching based on dry etching.

Alternatively, the surface asperity $17p$ may be formed by dry etching using a mask. In this case, despite cost increase due to the increased number of processes, the surface asperity $17p$ can be formed as designed. Hence, the light extraction efficiency is easily increased.

To effectively extract emission light to the outside by varying its incident angle, the size of the surface asperity $17p$ is preferably equal to or larger than the emission wavelength in the stacked structure. If the surface asperity $17p$ is smaller than the emission wavelength, the emission light incident on the surface asperity $17p$ exhibits wave-optical behavior such as scattering and diffraction at the surface asperity interface. Hence, part of the emission light otherwise transmitted therethrough is not extracted. Furthermore, if the surface asperity $17p$ is sufficiently smaller than the emission wavelength, the surface asperity $17p$ is regarded as a layer with a continuously varying refractive index. Hence, the surface asperity $17p$ is similar to a flat surface without surface asperity, and does not improve the light extraction efficiency.

A semiconductor light-emitting device with an emission wavelength of 390 nm (the emission wavelength in the stacked structure being approximately 155 nm) was fabricated based on this embodiment. According to experimental results using this semiconductor light-emitting device, as the size of the surface asperity $17p$ increases, the optical output power tends to increase. Until the size of the surface asperity $17p$ reaches approximately 2 μm, the optical output power tends to gradually increase. Hence, the size of the surface asperity 17p is preferably twice or more, and more preferably 10 times or more, of the emission wavelength in the stacked structure.

In this embodiment, in the case of surface asperity processing with KOH solution using the n-side electrode as a mask, it is necessary to protect the layer susceptible to etching with KOH solution, such as a Ti layer. For instance, after forming up to Ti/Pt by e-gun evaporation, Au is formed by resistance heating evaporation to protect the first layer, i.e., Ti. The Au layer formed by resistance heating evaporation is evaporated more isotropically than other metal layers formed by e-gun evaporation. Hence, the Au layer can be extended to the inside of the overhang structure of the lift-off resist. Thus, Ti/Pt can be entirely covered with Au. Alternatively, a metal film resistant to KOH solution can be used as a mask. If this metal film has good ohmic contact with the n-type contact layer, the metal film may be used as is. If there is any problem with ohmic contact, the metal film can be removed after surface asperity processing, and an n-side electrode can be formed separately.

The material of the n-side electrode is not particularly limited. For instance, with the first layer made of Al, the n-side electrode has good ohmic characteristics and low contact resistance with the n-type contact layer, and also serves as a reflective electrode. Thus, the light extraction efficiency and the design flexibility of the n-side electrode are improved. In view of poor environment resistance of Al, an Al alloy containing a slight amount of Si, for instance, can be used to improve the reliability and adhesiveness.

In the region for wire bonding on the n-side electrode, to improve bonding characteristics, Au can be formed thickly, e.g., to a thickness of 10 μm, by plating on the surface of the n-side electrode.

Comparative Example

The semiconductor light-emitting device 120 of the second comparative example shown in FIG. 3C is fabricated as follows. After removing the sapphire substrate from the conductive substrate, the non-doped GaN buffer layer on the conductive substrate is removed by dry etching to expose the n-type contact layer. By e.g. lift-off, a Ti/Pt/Au stacked film, for instance, is formed to a thickness of e.g. 500 nm so as to cover part of the exposed n-type contact layer. The stacked film is patterned into an n-side electrode. Subsequently, the surface of the n-type contact layer outside the n-side electrode is processed by alkaline etching with KOH solution to form a surface asperity.

In this comparative example, surface asperity processing is performed on the n-type contact layer. Hence, a thick n-type contact layer is needed to obtain a large and dense surface asperity. Thus, there is concern about the cost increase due to prolonged growth and the decrease of light extraction efficiency due to increased internal absorption. In particular, for ultraviolet light, the increase of internal absorption due to the increased film thickness of GaN is significant.

Furthermore, because silver is used for the reflective electrode (p-side electrode) and solder is used as the bonding material, it is difficult to perform high temperature sintering on the n-side electrode. Thus, to achieve good ohmic characteristics, an n-type contact layer highly doped with impurity is needed. Due to the effect of impurity, a highly doped GaN layer has higher internal absorption than a non-doped GaN buffer layer. This effect is significant in the surface asperity in which multiple reflection is repeated. Furthermore, a highly doped n-type contact layer is prone to surface roughness and impurity segregation caused by processing. This leads to the decrease of light extraction efficiency.

In contrast, in the semiconductor light-emitting device 100 according to this embodiment, surface asperity processing is performed on the non-doped GaN buffer layer. Hence, the film thickness of the n-type contact layer does not need to be thicker than necessary. Thus, surface roughness and impurity segregation of the surface asperity 17p can also be suppressed. Furthermore, in this example, the n-side electrode has a recessed shape. Hence, the n-side electrode can function as a guide for wire bonding. Thus, the positioning accuracy can be improved, allowing cost reduction by reducing the task time. Furthermore, thinning of the n-type contact layer allows cost reduction, optimization of crystal quality, and yield improvement by reduced substrate warpage.

In the semiconductor light-emitting device 100 according to this embodiment, in the case of forming the n-side electrode in a recessed region, the area of the n-side electrode in contact with the n-type contact layer in plan view is smaller than in the comparative example. However, because the n-side electrode is formed in a recessed region, the effective surface area is larger than the area in plan view. Furthermore, because of low contact resistance, the influence on the electrical characteristics is limited.

Thus, in the semiconductor light-emitting device 100, a surface asperity 17p is formed on the non-doped GaN buffer layer containing little impurity. An n-side electrode is formed on the highly doped n-type contact layer. Thus, a semiconductor light-emitting device with high efficiency can be achieved.

The role of increasing the light extraction efficiency is assigned to the non-doped GaN buffer layer, whereas the role of improving the electrical characteristics is assigned to the highly doped n-type contact layer. By this role sharing, the cost can be reduced while achieving high-level compatibility between light extraction efficiency and electrical characteristics.

Figure 5:
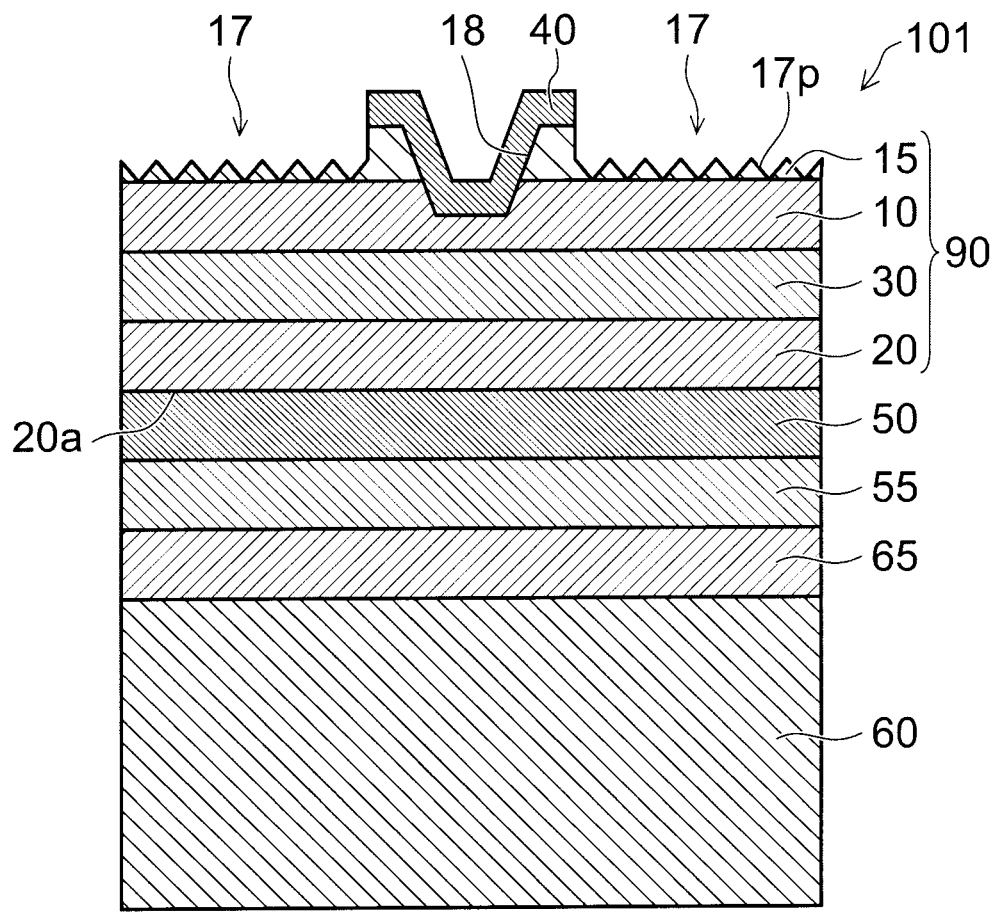
FIG. 5 is a schematic cross-sectional view showing the configuration of a semiconductor light-emitting device.

FIG. 5 is a schematic cross-sectional view illustrating the configuration of an alternative semiconductor light-emitting device according to the first embodiment.

As shown in FIG. 5, in the semiconductor light-emitting device 101, the third semiconductor layer 15 is thinner than in the semiconductor light-emitting device 100. Also in this case, the thin third semiconductor layer 15 is provided with a plurality of protrusions (surface asperity 17p). For instance, the bottom of the surface asperity 17p is located in the close vicinity of the first semiconductor layer 10. For instance, the bottom of the surface asperity 17p may be in contact with the first semiconductor layer 10. Such a semiconductor light-emitting device 101 can also achieve high efficiency.

FIGS. 6A to 6E are schematic views showing alternative semiconductor light-emitting devices according to the first embodiment.

In these figures, the configuration of the rough surface portion 17 and the first electrode 40 is different from that in the semiconductor light-emitting device 100.

Figure 6A:
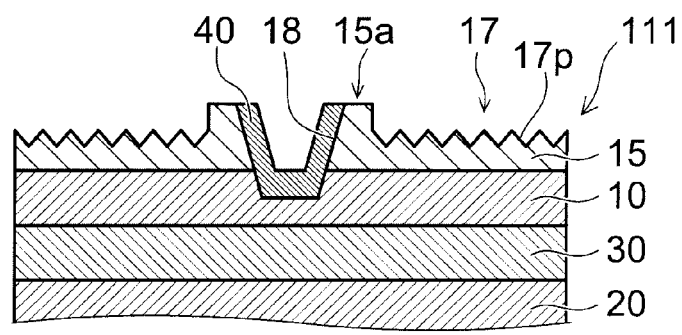
FIG. 6A to FIG. 6E are schematic cross-sectional views showing a semiconductor light-emitting devices.

As shown in FIG. 6A, in the semiconductor light-emitting device 111, the first electrode 40 covers the surface of the first semiconductor layer 10 at the bottom of the opening 18 and the inner wall of the opening 18. The upper surface of the first electrode 40 is substantially flush with the upper surface of the third semiconductor layer 15.

Figure 6B:
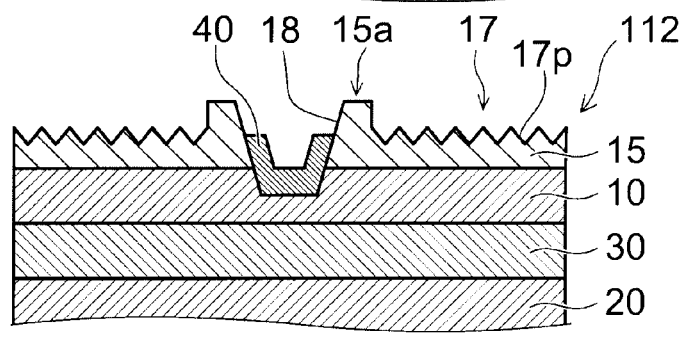

As shown in FIG. 6B, in the semiconductor light-emitting device 112, the first electrode 40 is buried inside the opening 18. The upper surface of the first electrode 40 is located between the upper surface of the first semiconductor layer 10 and the upper surface of the third semiconductor layer 15.

Figure 6C:
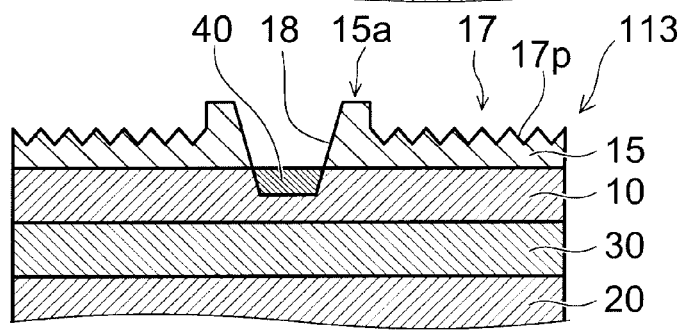

As shown in FIG. 6C, in the semiconductor light-emitting device 113, the first electrode 40 is buried in the first semiconductor layer 10 inside the opening 18. That is, the height of the upper surface of the first electrode 40 is substantially matched with the height of the upper surface of the first semiconductor layer 10.

Figure 6D:
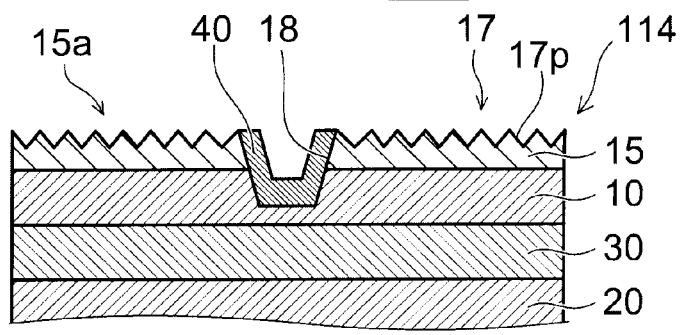
Figure 6E:
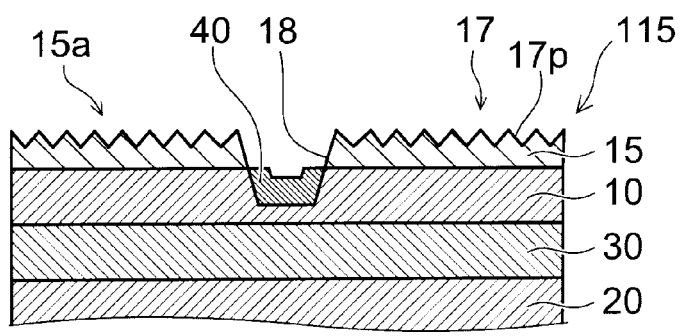

As shown in FIGS. 6D and 6E, in the semiconductor light-emitting device 114 and the semiconductor light-emitting device 115, the surface asperity 17p is provided entirely on the major surface 15a of the third semiconductor layer 15, and the first electrode 40 is provided inside the opening 18. In the semiconductor light-emitting device 114, the upper surface of the first electrode 40 is substantially flush with the first major surface 15a of the third semiconductor layer 15. In the semiconductor light-emitting device 115, the upper surface of the first electrode 40 is located below the first major surface 15a of the third semiconductor layer 15.

Figure 7:
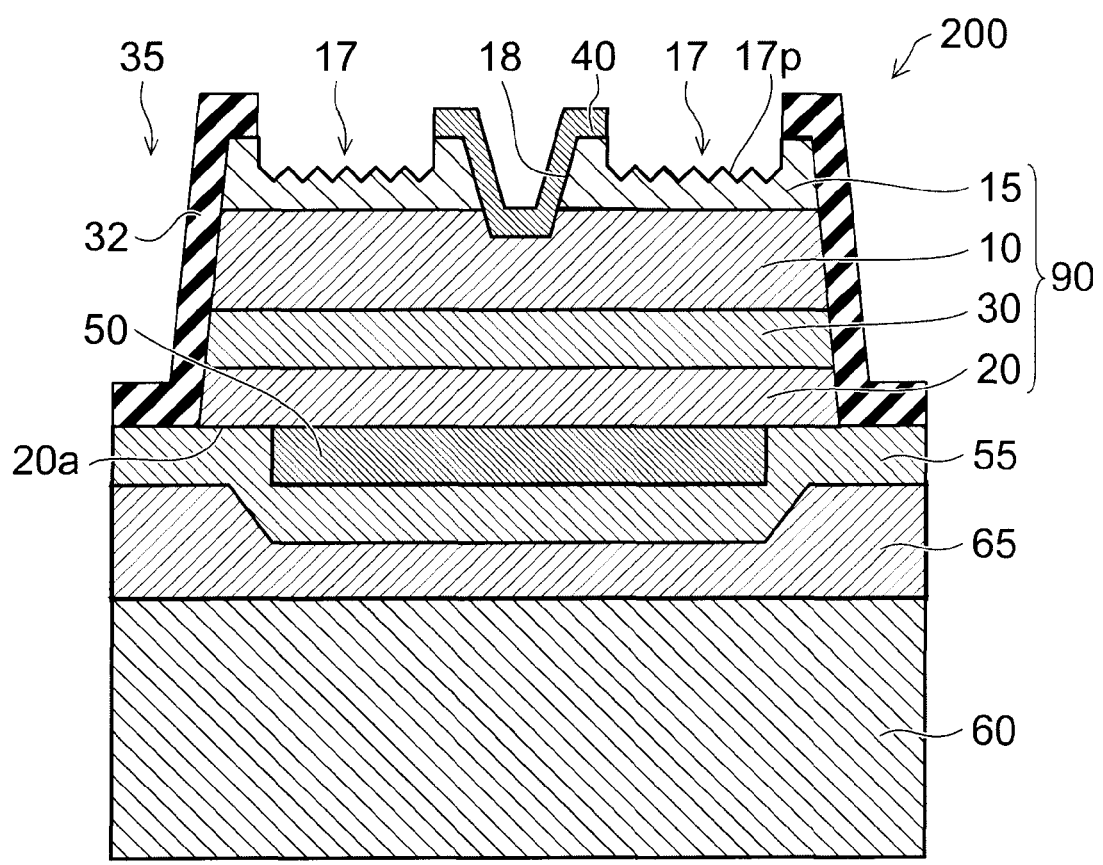
FIG. 7 is a schematic cross-sectional view showing a semiconductor light-emitting device.

FIG. 7 is a schematic sectional view illustrating the configuration of an alternative semiconductor light-emitting device according to the first embodiment.

As shown in FIG. 7, the semiconductor light-emitting device 200 further includes a dielectric film 32 provided on the side surface of the stacked structure 90. In the semiconductor light-emitting device 200, for instance, after patterning the second electrode 50 and removing the sapphire substrate, a device isolation trench 35 is formed in the stacked structure 90. A dielectric film 32 is formed on the side surface of the stacked structure 90.

An example method for manufacturing the semiconductor light-emitting device 200 is described.

First, after forming the stacked structure 90, a p-side electrode is formed. Here, the p-side electrode is patterned by lift-off so as to be narrower than the pitch of device isolation trenches formed later. After lift-off, sintering treatment is performed in an oxygen atmosphere at 400° C. for 1 min. Then, as an adhesion metal layer 55, for instance, Ni/Au is formed to a film thickness of 1000 nm entirely on the major surface of the p-type GaN layer side, including on the p-side electrode.

Subsequently, an AuSn solder with a film thickness of 3 μm formed on the conductive substrate made of Ge is opposed to the adhesion metal layer 55 formed on the stacked structure. By heating to a temperature equal to or higher than the eutectic point of AuSn, such as 300° C., the conductive substrate is bonded to the sapphire substrate.

Then, from the sapphire substrate side, for instance, the fourth harmonic (266 nm) laser light of an YVO$_4$ solid-state laser is applied. Thus, GaN in the GaN buffer layer on the single crystal AlN buffer layer side is decomposed by generated heat. The decomposed GaN is removed by e.g. hydrochloric acid treatment. Thus, the sapphire substrate is removed and separated from the stacked structure.

After removing the sapphire substrate, part of the non-doped GaN buffer layer is removed to expose the n-type contact layer. For instance, this is performed by dry etching with chlorine gas using a resist mask. Then, to separate the stacked structure into individual devices, part of the stacked structure is completely removed by dry etching using a resist mask to form a device isolation trench. Here, to prevent step disconnection of SiO$_2$ formed later, the device isolation trench is preferably shaped like a taper. Subsequently, by a sputtering apparatus, for instance, SiO$_2$ constituting a dielectric film 32 is formed to a film thickness of 400 nm entirely on the major surface on the stacked structure side.

Next, a lift-off resist is formed so as to expose SiO$_2$ in a region covering entirely the exposed n-type contact layer and partly the non-doped GaN buffer layer. Ammonium fluoride treatment is performed to remove SiO$_2$ in that region. In the region where SiO$_2$ has been removed, by lift-off, a Ti/Pt/Au stacked film, for instance, is formed to a thickness of e.g. 500 nm. The stacked film is patterned into an n-side electrode. Subsequently, a resist is formed so as to expose a portion of SiO$_2$ covering the non-doped GaN buffer layer outside the n-side electrode. The portion of SiO$_2$ is removed with ammonium fluoride to expose the non-doped GaN buffer layer. The surface of the exposed non-doped GaN buffer layer is processed by alkaline etching with KOH solution to form a surface asperity 17p.

Thus, the semiconductor light-emitting device 200 illustrated in FIG. 7 is fabricated.

Ag used for the p-side electrode is altered or degraded by dry etching and alkaline etching. This leads to degradation in the reflection characteristics for emission light and the electrical characteristics of the p-type GaN layer. However, as in this embodiment, by enclosing the p-side electrode with the p-type GaN layer and the adhesion metal layer 55, the degradation of the p-side electrode can be suppressed. Consequently, the adhesion metal layer 55 rises in the region where the p-side electrode is formed. However, when the adhesion metal layer 55 is bonded with the solder on the conductive substrate, the solder is deformed so that the adhesion metal layer 55 including the region outside the p-side electrode can be bonded.

Thus, by forming SiO$_2$, the lateral side of the light-emitting layer can be passivated, and the electrical characteristics can be improved.

Second Embodiment

Figure 8A:
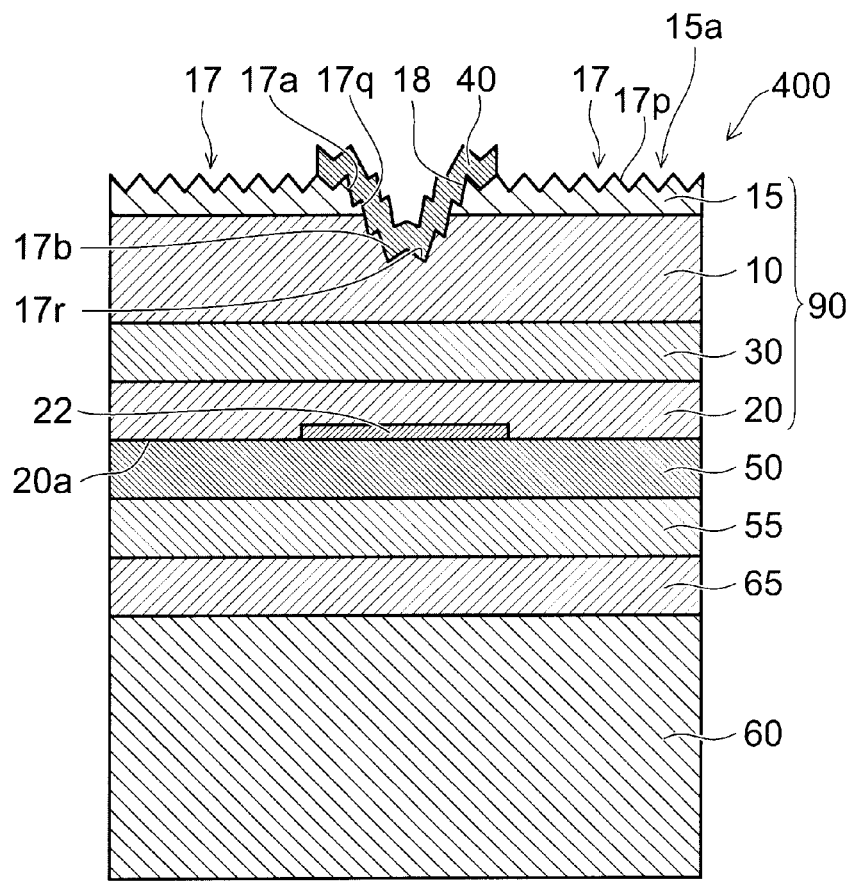
FIG. 8A and FIG. 8B are schematic views showing a semiconductor light-emitting device.
Figure 8B:
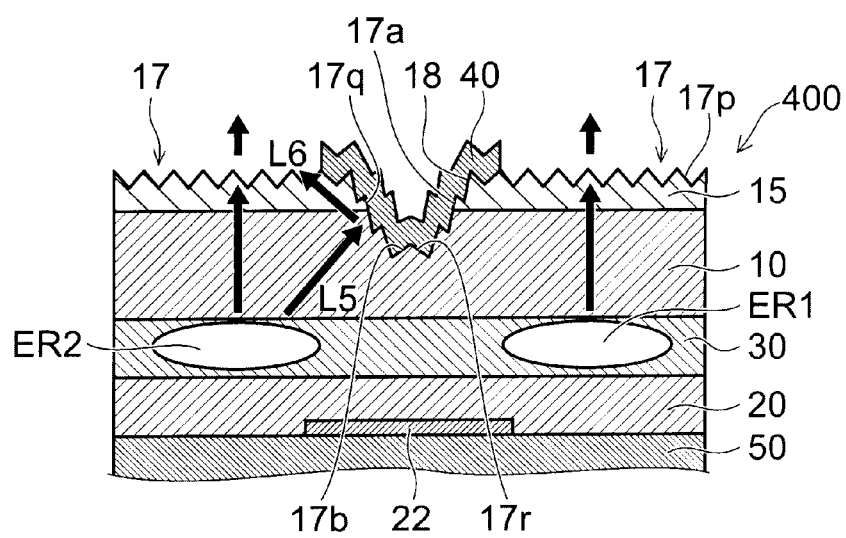

FIG. 8A and FIG. 8B are schematic views illustrating the configuration and characteristics of a semiconductor light-emitting device according to a second embodiment.

More specifically, FIG. 8A is a schematic cross-sectional view illustrating the structure of the semiconductor light-emitting device 400. FIG. 8B is a schematic view showing the characteristics of the semiconductor light-emitting device 400.

As shown in FIG. 8A, in the semiconductor light-emitting device 400 according to this embodiment, a sidewall rough surface portion 17a is further provided on the sidewall of the opening 18 of the third semiconductor layer 15. On the surface of the first semiconductor layer 10 corresponding to the opening 18, a first semiconductor layer rough surface portion 17b is further provided. The sidewall rough surface portion 17a includes a sidewall surface asperity 17q. The first semiconductor layer rough surface portion 17b includes a first semiconductor layer surface asperity 17r. The size (width) of the sidewall surface asperity 17q is larger than the wavelength in the third semiconductor layer 15 of the peak wavelength of emission light emitted from the light-emitting layer 30. The size (width) of the first semiconductor layer surface asperity 17r is larger than the wavelength in the first semiconductor layer 10 of the peak wavelength of emission light emitted from the light-emitting layer 30.

Furthermore, at least on the side of the interface where the first electrode 40 is in contact with the first semiconductor layer 10, the first electrode 40 includes Al or an Al alloy. Thus, like the second electrode 50, the first electrode 40 can also function as a reflective electrode.

On the other hand, the second semiconductor layer 20 includes a low electrical characteristics portion 22. As viewed along the stacking direction from the first semiconductor layer 10 to the second semiconductor layer 20, the low electrical characteristics portion 22 is provided in a region including the region where the second semiconductor layer 20 overlaps the first electrode 40. The low electrical characteristics portion 22 has at least one of higher contact resistance and lower ohmic characteristics between the second semiconductor layer and the second electrode than the region where the second semiconductor layer 20 does not overlap the first electrode 40.

As illustrated in FIG. 8B, a current is passed from the second electrode 50 toward the first electrode 40 of the semiconductor light-emitting device 400. The low electrical characteristics portion 22 has low electrical characteristics (at least one of high contact resistance and low ohmic characteristics). Hence, the current is injected into the light-emitting layer 30 from the region opposed to the rough surface portion 17. Thus, emission light is mainly emitted from the light-emitting regions ER1 and ER2 opposed to the rough surface portion 17. On the other hand, light emission is relatively suppressed in the region between the first electrode 40 and the low electrical characteristics portion 22.

That is, in the semiconductor light-emitting device 400, by providing the low electrical characteristics portion 22, the path of current injected into the light-emitting layer 30 can be shifted to the light-emitting regions ER1, ER2 opposed to the rough surface portion 17. Thus, the light-emitting regions ER1, ER2 mainly emit light. Hence, emission light can be efficiently extracted from the rough surface portion 17 to the outside of the stacked structure 90.

Furthermore, the first semiconductor layer surface asperity 17r is provided in the first semiconductor layer 10 at the bottom of the opening 18. The sidewall surface asperity 17q is provided in the third semiconductor layer 15 corresponding to the side surface of the opening 18. Furthermore, the first electrode 40 is formed as a reflective electrode. Thus, light L5 is extracted outside as light L6. Hence, the light extraction efficiency can be increased.

An example method for manufacturing the semiconductor light-emitting device 400 is described.

First, before forming a p-side electrode, a resist mask is formed to expose the p-type GaN layer in the region immediately below the area for forming the n-side electrode (the region may include its surroundings as necessary, e.g., the region may reach approximately 20 μm away from immediately below the n-side electrode). In this state, the second semiconductor layer 20 is subjected to e.g. $O_2$ ashing treatment. Subsequently, as in the first embodiment, the process from the formation of the p-side electrode to the removal of the sapphire substrate is performed.

After removing the sapphire substrate, part of the non-doped GaN buffer layer is removed to expose the n-type contact layer. For instance, this is performed by dry etching with chlorine gas using a resist mask. Next, the surface of the exposed n-type contact layer and the surface of the non-doped GaN buffer layer are processed by alkaline etching with KOH solution to form a surface asperity. Then, by e.g. lift-off, an Al/Ni/Au stacked film, for instance, is formed to a thickness of e.g. 700 nm so as to cover entirely the exposed n-type contact layer and partly the non-doped GaN buffer layer. The stacked film is patterned into an n-side electrode.

The surface of the p-type GaN layer treated by $O_2$ ashing is significantly degraded in ohmic characteristics and contact resistance. Hence, little current flows therein. Thus, no light emission occurs in the light-emitting layer immediately below the n-side electrode and therearound. In the structure as in the first embodiment, with the increase of current, the current starts to concentrate on the light-emitting layer immediately below the n-side electrode. This results in the increase of operating voltage due to nonuniform injection, the decrease of light extraction efficiency due to absorption of emission light in the n-side electrode, and the decrease of light emission efficiency due to increased current density. According to this embodiment, the current concentration can be prevented. Besides $O_2$ ashing treatment, it is also possible to use dry etching or wet etching to thinly strip the surface of the p-type GaN layer. Simple exposure to a plasma atmosphere may also be used.

Furthermore, the n-side electrode is formed as a reflective electrode. Hence, emission light is not absorbed by the n-side electrode, and the light extraction efficiency is increased. In this embodiment, the current is prevented from flowing immediately below the n-side electrode. This is particularly effective for the structure in which light emission occurs also immediately below the n-side electrode and therearound. Thus, the design flexibility of the n-side electrode is increased.

By forming the n-side electrode as a reflective electrode and performing surface asperity processing also immediately below the n-side electrode, the chances of varying the incident angle of emission light with respect to the light-extracting portion can be increased. Thus, the light extraction efficiency is increased. For instance, as in this embodiment, in the case where no light emission occurs immediately below the n-side electrode and therearound, the light incident on the surface asperity immediately below the n-side electrode is primarily composed of the reflected emission light without being extracted outside. Hence, in this case, this embodiment is more effective.

Although Al is a metal having a problem with adhesiveness, formation of a surface asperity can improve the adhesiveness. Furthermore, in the case of forming the n-side electrode in a recess from which part of the n-type contact layer has been removed, the effective surface area of the n-side electrode increases. This enhances the effect achieved by forming the n-side electrode as a reflective electrode. Furthermore, because of the configuration in which the recess having a reflective structure is formed in the stacked structure, it is easy to vary the reflection angle of emission light propagated in the stacked structure without being extracted outside. This facilitates increasing the light extraction efficiency.

Figure 9A:
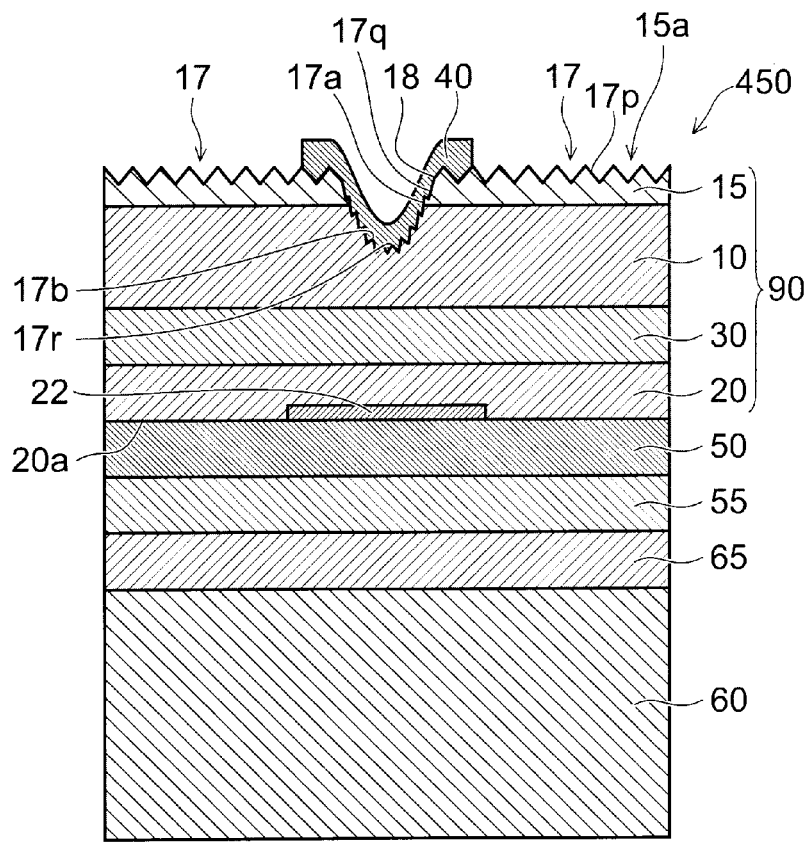
FIG. 9A and FIG. 9B are schematic views showing a semiconductor light-emitting device.
Figure 9B:
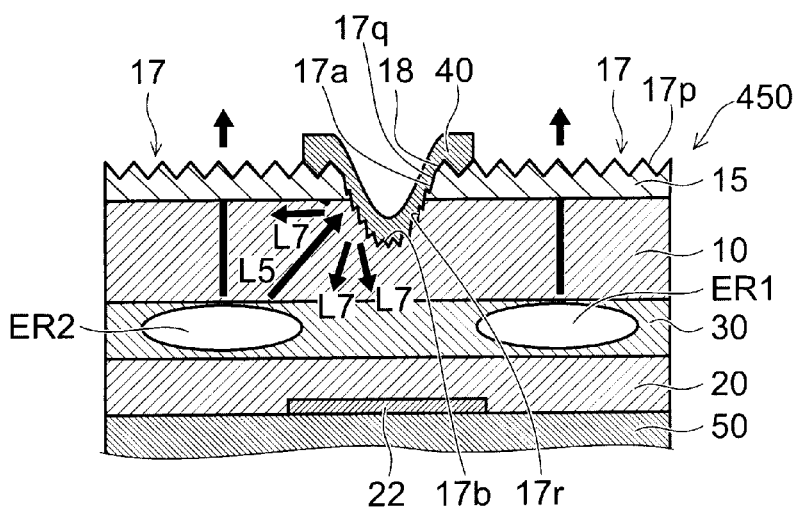

FIG. 9A and FIG. 9B are schematic views illustrating the configuration and characteristics of an alternative semiconductor light-emitting device according to the second embodiment.

More specifically, FIG. 9A is a schematic cross-sectional view illustrating the configuration of the semiconductor light-emitting device 450. FIG. 9B is a schematic view illustrating the characteristics of the semiconductor light-emitting device 450.

As shown in FIG. 9A, in the alternative semiconductor light-emitting device 450 according to this embodiment, the first semiconductor layer surface asperity 17r of the first semiconductor layer rough surface portion 17b provided in the first semiconductor layer 10 corresponding to the opening 18 has a smaller size than the surface asperity 17p of the rough surface portion 17. The surface asperity 17p of the rough surface portion 17 is larger than the peak wavelength of emission light. The size of the first semiconductor layer surface asperity 17r is, for instance, comparable to or smaller than the peak wavelength of emission light.

As shown in FIG. 9B, light L5 is emitted from the light-emitting regions ER1 and ER2 of the light-emitting layer 30 opposed to the rough surface portion 17. Then, the light L5 propagated toward the first electrode 40 is reflected at the interface between the first electrode 40 and the first semiconductor layer 10. Because the size of the first semiconductor layer surface asperity 17r is as small as the wavelength, the light L5 is diffused by the effect of scattering and diffraction, and reflected in a relatively isotropic manner. Thus, the light L7 reflected at the interface between the first electrode 40 and the first semiconductor layer 10 is isotropically propagated in the stacked structure 90. Hence, the light extraction efficiency can be increased.

Next, an example method for manufacturing the semiconductor light-emitting device 450 is described regarding differences from that for the semiconductor light-emitting device 400.

After removing part of the non-doped GaN buffer layer to expose the n-type contact layer, the major surface is entirely dry etched under the condition favoring anisotropic etching depending on the crystal orientation. For instance, it is possible to use etching with chlorine based on ICP-RIE, with the milling-like etching mode suppressed. In this case, the non-doped GaN buffer layer and the n-type contact layer have different etching rates, such as 2:1. Using this etching rate difference, a surface asperity 17p equal to or larger than the emission wavelength is formed in the non-doped GaN buffer layer, and simultaneously, a surface asperity equal to or smaller than the emission wavelength (first semiconductor layer surface asperity 17r) is formed in the n-type contact layer.

In the region of the n-type contact layer immediately below the n-side electrode, diffuse reflection occurs due to scattering and diffraction, exhibiting relatively isotropic reflection characteristics. This can increase the chances that the emission light incident on the surface asperity immediately below the n-side electrode (first semiconductor layer surface asperity 17r and sidewall surface asperity 17q) varies its incident angle with respect to the light-extracting portion. Thus, the light extraction efficiency is increased.

The method for manufacturing a semiconductor apparatus according to an embodiment of the invention is a method for manufacturing the aforementioned semiconductor apparatus.

More specifically, this manufacturing method is a method for manufacturing a semiconductor light-emitting device having a stacked structure 90. The stacked structure 90 includes a first semiconductor layer 10 of a first conductivity type, a second semiconductor layer 20 of a second conductivity type, a light-emitting layer 30 provided between the first semiconductor layer 10 and the second semiconductor layer 20, and a third semiconductor layer 15 provided on the opposite side of the first semiconductor layer 10 from the light-emitting layer 30 and having a lower impurity concentration than the first semiconductor layer 10.

In this manufacturing method, first, on a sapphire substrate 5 via a buffer layer including AlN, the third semiconductor layer 15, the first semiconductor layer 10, the light-emitting layer 30, and the second semiconductor layer 20 are formed in the order of the third semiconductor layer 15, the first semiconductor layer 10, the light-emitting layer 30, and the second semiconductor layer 20 to form the stacked structure 90.

Then, after bonding the stacked structure 90 to a conductive substrate, the sapphire substrate is separated from the stacked structure 90 between the buffer layer and the third semiconductor layer 15.

Furthermore, on the surface of the third semiconductor layer 15 exposed by separating the sapphire substrate 5, a surface asperity 17p is formed. The surface asperity 17p is larger than the wavelength in the third semiconductor layer 15 of the peak wavelength of emission light emitted from the light-emitting layer 30.

The aforementioned formation of the surface asperity 17p can include the process of wet etching the third semiconductor layer 15 with KOH solution.

The aforementioned surface of the third semiconductor layer 15 exposed by separating the sapphire substrate 5 is an N surface of a GaN crystal. The aforementioned formation of the surface asperity 17p can include the process of performing anisotropic dry etching on the third semiconductor layer 15.

Figure 10:
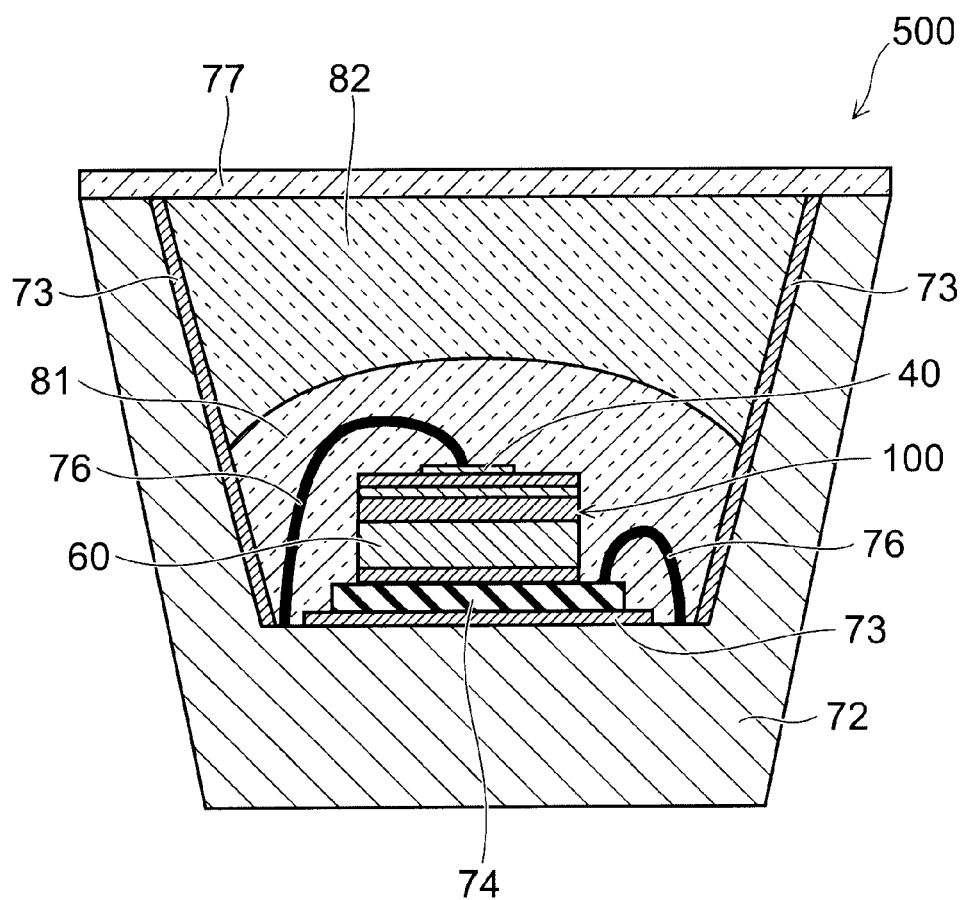
FIG. 10 is a schematic cross-sectional view showing a semiconductor light-emitting apparatus based on the semiconductor light-emitting device.

FIG. 10 is a schematic cross-sectional view illustrating the configuration of a semiconductor light-emitting apparatus based on the semiconductor light-emitting device according to the embodiment of the invention.

In this example, the semiconductor light-emitting device 100 according to the first embodiment is used. However, the semiconductor light-emitting apparatus can be based on any of the semiconductor light-emitting devices according to the above embodiments.

The semiconductor light-emitting apparatus 500 is a white LED in which the semiconductor light-emitting device 100 is combined with phosphor. More specifically, the semiconductor light-emitting apparatus 500 according to this embodiment includes the semiconductor light-emitting device 100 and phosphor. The phosphor absorbs light emitted from the semiconductor light-emitting device and emits light having a wavelength different from that of the light.

As shown in FIG. 10, in the semiconductor light-emitting apparatus 500 according to this embodiment, reflective films 73 are provided on the inner surface of a package 72 made of e.g. ceramic. The reflective films 73 are separately provided on the inner side surface and the bottom surface of the package 72. The reflective film 73 is made of e.g. aluminum. On the reflective film 73 provided at the bottom of the package 72, the semiconductor light-emitting device 100 is placed via a submount 74.

The semiconductor light-emitting device 100 is directed so that the side of the major surface 15a provided with the first electrode 40 faces up. For instance, using a low-temperature solder, the rear surface of the conductive substrate 60 is fixed to the submount 74. Alternatively, to fix the semiconductor light emitting device 100, the submount 74, and the reflective films 73, bonding with adhesive can also be used.

On the surface of the submount 74 on the semiconductor light-emitting device side, an electrode for mounting the conductive substrate 60 of the semiconductor light-emitting device 100 is formed. The electrode is connected through a bonding wire 76 to an electrode, not shown, provided on the package 72 side. On the other hand, the first electrode 40 is also connected through a bonding wire 76 to an electrode, not shown, provided on the package 72 side. These connections are made in a portion between the reflective film 73 on the inner side surface and the reflective film 73 on the bottom surface.

Furthermore, a first phosphor layer 81 containing red phosphor is provided so as to cover the semiconductor light-emitting device 100 and the bonding wires 76. On this first phosphor layer 81 is formed a second phosphor layer 82 containing blue, green, or yellow phosphor. A lid 77 made of silicone resin is provided on this phosphor layer.

The first phosphor layer 81 contains resin and red phosphor dispersed in this resin.

The red phosphor can be based on a matrix made of e.g. $Y_2O_3$, $YVO_4$, or $Y_2(P,V)O_4$, and contains therein trivalent Eu ($Eu^{3+}$) as an activator. That is, $Y_2O_3:Eu^{3+}$, $YVO_4:Eu^{3+}$ and the like can be used as red phosphor. The concentration of $Eu^{3+}$ can be 1% to 10% in terms of molarity.

Besides $Y_2O_3$ and $YVO_4$, the matrix of the red phosphor can be LaOS or $Y_2(P,V)O_4$. Besides $Eu^{3+}$, it is also possible to use $Mn^{4+}$ and the like. In particular, addition of a small amount of Bi in combination with trivalent Eu to the $YVO_4$ matrix increases absorption at 380 nm. This can further increase the light emission efficiency. The resin can be e.g. silicone resin.

The second phosphor layer 82 contains resin and at least one of blue, green, and yellow phosphor dispersed in this resin. For instance, it is possible to use a phosphor combination of blue phosphor and green phosphor, a phosphor combination of blue phosphor and yellow phosphor, and a phosphor combination of blue phosphor, green phosphor, and yellow phosphor.

The blue phosphor can be made of e.g. $(Sr,Ca)_{10}(PO_4)_6Cl_2$: $Eu^{2+}$ or $BaMg_2Al_{16}O_{27}$:$Eu^{2+}$.

The green phosphor can be e.g. $Y_2SiO_5$:$Ce^{3+}$,$Tb^{3+}$ with trivalent Tb acting as an emission center. In this case, energy transfer from the Ce ion to the Tb ion enhances excitation efficiency. Alternatively, the green phosphor can be e.g. $Sr_4Al_{14}O_{25}$: $Eu^{2+}$.

The yellow phosphor can be e.g. $Y_3Al_5$:$Ce^{3+}$.

The resin can be e.g. silicone resin. In particular, trivalent Tb exhibits sharp light emission around 550 nm where the visibility is maximized. Hence, its combination with the red emission of trivalent Eu significantly enhances the light emission efficiency.

In the semiconductor light-emitting apparatus 500 according to this embodiment, the 380-nm ultraviolet light generated from the semiconductor light-emitting device 100 is emitted to the upper and lateral side of the semiconductor light-emitting device 100. In combination with reflection at the reflective film 73, the aforementioned phosphors contained in the phosphor layers can be efficiently excited. For instance, the aforementioned phosphor contained in the first phosphor layer 81, with trivalent Eu and the like acting as an emission center, converts the aforementioned light into light with a narrow wavelength distribution around 620 nm. Thus, red visible light can be efficiently obtained.

Furthermore, the blue, green, and yellow phosphor contained in the second phosphor layer 82 are efficiently excited. Thus, blue, green, and yellow visible light can be efficiently obtained. As a color mixture thereof, white light and light of various other colors can be efficiently obtained with good color rendition.

Thus, in the semiconductor light-emitting apparatus 500, a semiconductor light-emitting apparatus with high efficiency is achieved.

The "nitride semiconductor" referred to herein includes semiconductors having any composition represented by the chemical formula $B_xIn_yAl_zGa_{1-x-y-z}N$ ($0 \leq x \leq 1$, $0 \leq y \leq 1$, $0 \leq z \leq 1$, $x+y+z \leq 1$) where the composition ratios x, y, and z are varied in the respective ranges. Furthermore, in the above chemical formula, the "nitride semiconductor" also includes those further containing any group V element other than N (nitrogen), those further containing various elements added for controlling various material properties such as conductivity type, and those further containing various unintended elements.

The embodiments of the invention have been described with reference to examples. However, the invention is not limited to these examples. For instance, the semiconductor layer, electrode, substrate and the like included in the semiconductor light-emitting device can be variously modified by those skilled in the art. Such modifications are also encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible. Such combinations are also encompassed within the scope of the invention as long as they fall within the spirit of the invention.

Furthermore, those skilled in the art can suitably modify and implement the semiconductor light-emitting device described above in the embodiments of the invention. All the semiconductor light-emitting devices thus modified are also encompassed within the scope of the invention as long as they fall within the spirit of the invention.

Furthermore, those skilled in the art can conceive various modifications and variations within the spirit of the invention. It is understood that such modifications and variations are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor light-emitting device comprising:
a first semiconductor layer of a first conductivity type;
a second semiconductor layer of a second conductivity type;
a light-emitting layer provided between the first semiconductor layer and the second semiconductor layer;
a third semiconductor layer provided on opposite side of the first semiconductor layer from the light-emitting layer, having an impurity concentration lower than an impurity concentration of the first semiconductor layer, and including an opening exposing a part of the first semiconductor layer; and
a first electrode in contact with the first semiconductor layer through the opening,
the third semiconductor layer further including a rough surface portion, the rough surface portion being provided on opposite side from the first semiconductor layer and including a surface asperity larger than wavelength in the third semiconductor layer of peak wavelength of emission light emitted from the light-emitting layer,
wherein the first semiconductor layer includes a first semiconductor layer surface asperity provided in a region of the first semiconductor layer in contact with the first electrode and being smaller than the surface asperity of the rough surface portion.

2. The device according to claim 1, wherein the rough surface portion includes a plurality of protrusions, and a maximum width of at least one of the plurality of protrusions along a direction perpendicular to a stacking direction from the first semiconductor layer to the second semiconductor layer is larger than the wavelength in the third semiconductor layer of the peak wavelength of the emission light emitted from the light-emitting layer.

3. The device according to claim 2, wherein the maximum width is larger than twice the wavelength in the third semiconductor layer.

4. The device according to claim 2, wherein
the third semiconductor layer includes GaN, and
the protrusion is shaped like a hexagonal pyramid.

5. The device according to claim 1, wherein the surface asperity is provided by etching the third semiconductor layer.

6. The device according to claim 1, wherein the third semiconductor layer is a non-doped layer.

7. The device according to claim 1, further comprising:
a second electrode provided on a second major surface of the second semiconductor layer on opposite side from the light-emitting layer,
the second semiconductor layer including a low electrical characteristics portion, and
as viewed along a stacking direction from the first semiconductor layer to the second semiconductor layer, the low electrical characteristics portion being provided in a region including a region where the second semiconductor layer overlaps the first electrode, and the low electrical characteristics portion having at least one of higher contact resistance and lower ohmic characteristics between the second semiconductor layer and the second electrode than a region where the second semiconductor layer does not overlap the first electrode.

8. The device according to claim 1, further comprising:
a second electrode provided on a second major surface of the second semiconductor layer on opposite side from the light-emitting layer,
the second electrode causing light emitted from the light-emitting layer to be reflected in a direction from the second electrode to the third semiconductor layer.

9. The device according to claim 8, wherein the second semiconductor layer includes a GaN layer in contact with the second electrode.

10. The device according to claim 1, further comprising:
a second electrode provided on a second major surface of the second semiconductor layer on opposite side from the light-emitting layer and including Ag.

11. The device according to claim 1, wherein the first electrode includes Al or an Al alloy.

12. The device according to claim 10, wherein the first electrode further includes Si.

13. The device according to claim 1, wherein the first semiconductor layer includes a first semiconductor layer surface asperity provided in a region of the first semiconductor layer in contact with the first electrode and being larger than wavelength in the first semiconductor layer of the peak wavelength of the emission light.

14. The device according to claim 1, wherein the opening expands along a direction from the first semiconductor layer to the third semiconductor layer.

15. The device according to claim 1, further comprising:
a conductive substrate provided on opposite side of the second semiconductor layer from the light-emitting layer and electrically connected to the second semiconductor layer.

16. The device according to claim 15, wherein the conductive substrate is one of a silicon (Si) substrate, a germanium (Ge) substrate, and a metal plate including copper (Cu).

17. The device according to claim 1, further comprising:
a dielectric film provided on a side surface of the first semiconductor layer, the light-emitting layer and the second semiconductor layer.

18. The device according to claim 1, wherein the first conductivity type is n-type, and the second conductivity type is p-type.

19. The device according to claim 1, wherein the peak wavelength in air of light emitted from the light-emitting layer is 370 nanometers or more and 400 nanometers or less.

* * * * *